(12) United States Patent
Huang et al.

(10) Patent No.: US 10,199,478 B2
(45) Date of Patent: Feb. 5, 2019

(54) TRANSISTOR AND METHOD FOR FORMING THE SAME

(71) Applicants: Semiconductor Manufacturing International (Shanghai) Corporation, Shanghai (CN); NINGBO SEMICONDUCTOR INTERNATIONAL CORPORATION, Ningbo (CN)

(72) Inventors: Herb He Huang, Shanghai (CN); Clifford Ian Drowley, Shanghai (CN); Hai Ting Li, Shanghai (CN); Ji Guang Zhu, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 0 days.

(21) Appl. No.: 15/280,214

(22) Filed: Sep. 29, 2016

(65) Prior Publication Data

US 2017/0104084 A1 Apr. 13, 2017

(30) Foreign Application Priority Data

Oct. 10, 2015 (CN) .......................... 2015 1 0654312

(51) Int. Cl.
*H01L 29/66* (2006.01)
*H01L 29/786* (2006.01)
(Continued)

(52) U.S. Cl.
CPC .. *H01L 29/66484* (2013.01); *H01L 21/30625* (2013.01); *H01L 21/31111* (2013.01);
(Continued)

(58) Field of Classification Search
CPC ......... H01L 29/66484; H01L 29/66742; H01L 21/30625; H01L 21/76256;
(Continued)

(56) References Cited

U.S. PATENT DOCUMENTS 5,497,019 A 3/1996 Mayer et al.
6,359,312 B1 3/2002 Komatsu
(Continued)

*Primary Examiner* — Bo Fan
(74) *Attorney, Agent, or Firm* — Anova Law Group, PLLC

(57) ABSTRACT

The present disclosure provides a method for forming a transistor, including: forming a base structure, containing a first gate structure, an active layer covering the first gate structure, and an insulating structure in the active layer; forming a second gate structure on the active layer; forming a source-drain region, including a source region and a drain region in the active layer each on a different side of the second gate structure; and forming a first interlayer dielectric layer covering the base structure and the second gate structure. The method also includes: forming a first contact hole that exposes the first gate structure by etching the first interlayer dielectric layer and the insulating structure; and forming a second contact hole that exposes the second gate structure and a third contact hole that exposes the drain region by etching the first interlayer dielectric layer.

20 Claims, 8 Drawing Sheets

(51) Int. Cl.
  *H01L 21/306* (2006.01)
  *H01L 21/311* (2006.01)
  *H01L 21/762* (2006.01)

(52) U.S. Cl.
  CPC .. *H01L 21/31116* (2013.01); *H01L 21/76256* (2013.01); *H01L 29/66742* (2013.01); *H01L 29/78621* (2013.01); *H01L 29/78648* (2013.01)

(58) Field of Classification Search
  CPC ......... H01L 21/31116; H01L 21/31111; H01L 29/78648; H01L 29/78621
  USPC .................................. 438/585; 257/347, 773
  See application file for complete search history.

(56) References Cited

U.S. PATENT DOCUMENTS

| | | | |
|---|---|---|---|
| 6,664,598 B1 * | 12/2003 | Dennard | H01L 21/76264 257/347 |
| 2011/0291168 A1 * | 12/2011 | Iwasa | H01L 27/10873 257/296 |
| 2012/0097965 A1 * | 4/2012 | Shin | H01L 27/1285 257/72 |
| 2014/0332883 A1 * | 11/2014 | Kwon | H01L 27/0886 257/336 |
| 2015/0171215 A1 * | 6/2015 | Han | H01L 27/0207 365/208 |
| 2015/0270143 A1 | 9/2015 | Kalnitsky et al. | |

* cited by examiner

TRANSISTOR AND METHOD FOR FORMING THE SAME

CROSS-REFERENCES TO RELATED APPLICATIONS

This application claims the priority of Chinese Patent Application No. 201510654312.9 filed on Oct. 10, 2015, the entire content of which is incorporated herein by reference.

FIELD OF THE DISCLOSURE

The present disclosure generally relates to the field of semiconductor technology, and more particularly, relates to a transistor and a method for forming the transistor.

BACKGROUND

With the rapid development of semiconductor fabrication technology, semiconductor devices now have higher device densities and higher integration degrees. As a type of basic semiconductor devices, transistors are widely used in various applications. Thus, as the increase of device densities and integration degrees, the transistors are becoming smaller and smaller.

Radio frequency (RF) chips are widely used in RF technology. In an RF chip, the product of the on-resistance ($R_{on}$) and the off-capacitance ($C_{off}$) of a transistor is often an important indication or criterion of the RF performance of the RF chip. A smaller product value often indicates a better RF performance.

For a transistor with a certain gate electrode size, the value of the on-resistance of the transistor is inversely proportional to the intensity of drain current. However, as the size of a transistor decreases, it becomes more difficult to increase the drain current of the transistor.

BRIEF SUMMARY OF THE DISCLOSURE

One aspect of the present disclosure provides a method for forming a transistor, including: forming a base structure, containing a first gate structure, an active layer covering the first gate structure, and an insulating structure in the active layer; forming a second gate structure on the active layer; forming a source-drain region, including a source region and a drain region in the active layer each on a different side of the second gate structure; and forming a first interlayer dielectric layer covering the base structure and the second gate structure. The method also includes: forming a first contact hole that exposes the first gate structure by etching the first interlayer dielectric layer and the insulating structure; forming a second contact hole that exposes the second gate structure and a third contact hole that exposes the drain region by etching the first interlayer dielectric layer; and filling the first contact hole, the second contact hole, and the third contact hole with a conductive material to form a first plug structure, a second plug structure, and a third plug structure, that are aligned along a substantially same direction.

Another aspect of the present disclosure provides a transistor, including: a base structure, containing a first gate structure, an active layer covering the first gate structure, and an insulating structure in the active layer; a second gate structure on the active layer, the first gate structure and the second gate structure sharing the active layer; a source-drain region, having a source region and a drain region in the active layer, each on a different side of two sides of the first gate structure and the second gate structure; and a first interlayer dielectric layer covering the base structure and the second gate structure. The transistor also includes: a first plug structure, in the first interlayer dielectric layer and the insulating structure, being connected to the first gate structure; a second plug structure, in the first interlayer dielectric layer, being connected to the second gate structure; and a third plug structure, in the first interlayer dielectric layer, being connected to the drain region, wherein the first plug structure, the second plug structure, and the third plug structure being aligned along a substantially same direction.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
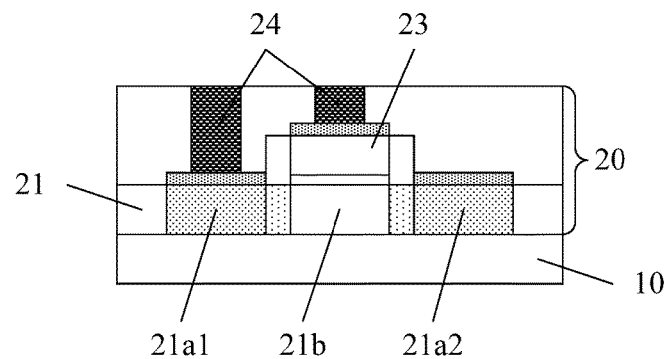
FIG. 1 illustrates a conventional semiconductor device.

In conventional technology, it is difficult to increase the drain current of a transistor. The reason for such difficulty is analyzed in view of the structure of a conventional transistor. FIG. 1 illustrates a cross-sectional view of a conventional semiconductor device.

As shown in FIG. 1, the semiconductor device includes a substrate 10 and a transistor 20 on the substrate 10. The transistor 20 includes an active layer 21 on the substrate 10. The source region 21a1, the drain region 21a2, and the channel region 21b between the source region 21a1 and the drain region 21a21, are formed in the active layer 21. The transistor also includes a gate structure 23 over the channel region 21b. The transistor further includes plugs 24 connected to the gate structure 23 and the source/drain region 21a1/21a2.

As shown in FIG. 1, the transistor 20 is positioned on one side of the substrate 10 and includes only one gate structure 23. Thus, when the transistor 20 is turned on, the channel, formed in the channel region 21b, is mainly distributed in the portion of the channel region 21b closer to the gate structure 23. That is, the on-current or source-drain current between the source region 21a1 and the drain region 21a2 is merely distributed on the side of the channel region 21b closer to the gate structure 23. The on-current is undesirably small on the side of the channel region 21b far away from the gate structure 23.

When the size of a gate structure is fixed, as the size of the transistor decreases, it becomes more difficult to increase the drain current of the transistor.

Various embodiments provide a transistor and fabrication method thereof. A base structure may contain a first gate structure, an active layer or a channel layer covering the first gate structure, and an insulating structure in the active layer. Further, a second gate structure may be formed on the active layer, and a source-drain region may be formed in the active layer at the two sides of the second gate structure. Further, a first interlayer dielectric layer, covering the base structure and the second gate structure may be formed. Further, the first interlayer dielectric layer and the insulating structure may be etched to form a first contact hole that exposes the first gate structure. The first interlayer dielectric layer may be etched to form the second contact hole and the third contact hole. The second contact may expose the second gate structure, and the third contact hole may expose the drain region. Further, a conductive material may be filled into the first contact hole, the second contact hole, and the third contact hole to form the first plug structure, the second plug structure, and the third plug structure, respectively.

In the present disclosure, the first gate structure may be formed in the base structure. The first plug structure, formed in the first interlayer dielectric layer and the insulating structure, may facilitate connection between the first gate structure and external circuit. The second gate structure may be formed on the active layer. That is, the disclosed transistor may include two gate structures positioned on the top side and on the bottom side of the active layer. The two gate structures may share the source-drain region. Thus, the channel of the transistor may be distributed on the two sides of the active layer formed with gate structures. Thus, the source-drain current of the transistor may be distributed on the two sides of the active layer. The drain current of the transistor may be increased and the on-resistance of the transistor may be reduced. The disclosed transistor and the chip containing the disclosed transistor may have improved performance.

Figure 15:
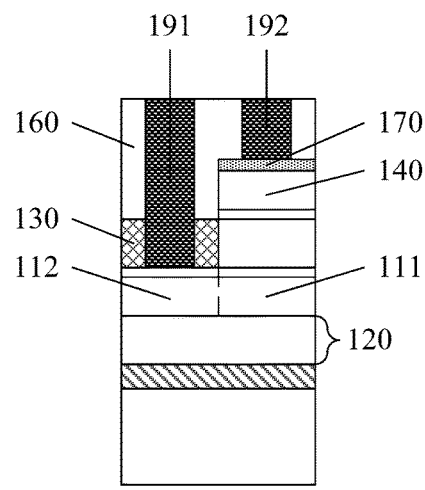
Figure 16:
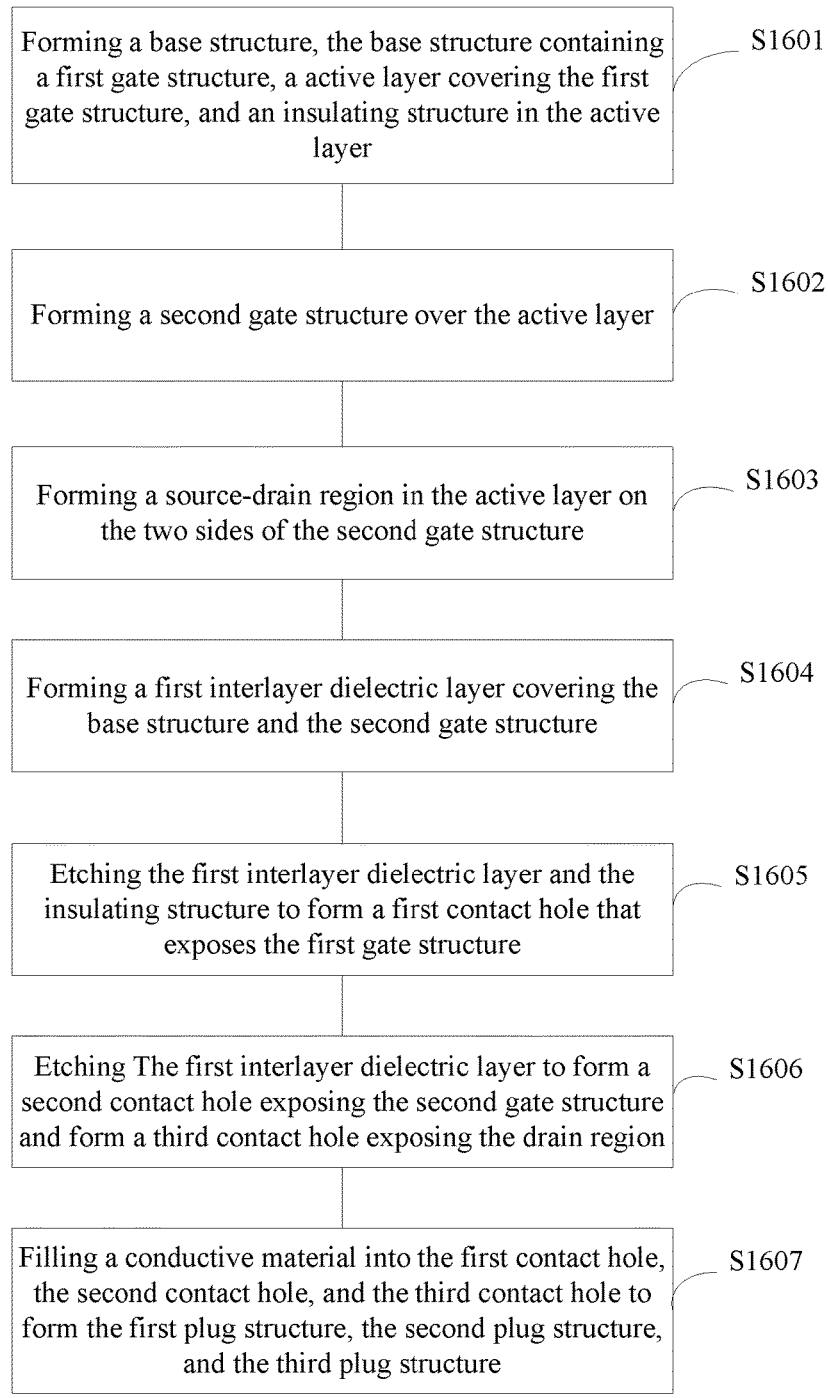
FIG. 16 illustrates a flow chart of an exemplary fabrication process in accordance with various embodiments of the present disclosure.

The embodiments of the present disclosure are illustrated in detail in view of the figures of the present disclosure. FIG. 16 illustrates an exemplary fabrication process to form the disclosed transistor. FIGS. 2-15 illustrate the cross-section views of the disclosed transistor at various stages of the exemplary fabrication process.

As shown in FIG. 16, at the beginning of the fabrication process, a base structure is formed. The base structure contains a first gate structure, an active layer covering the first gate structure, and an insulating structure formed in the active layer (S1601). FIGS. 2-5 illustrate corresponding structures.

Figure 5:
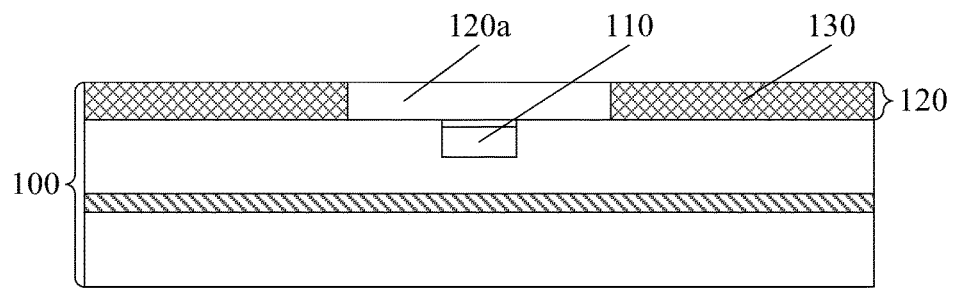

Referring to FIG. 5, a base structure 100 may be formed. A first gate structure 110 may be formed in the base structure 100, and an active layer 120 may be formed to cover the first gate structure 110. An insulating structure 130 may be formed in the active layer 120.

In one embodiment, the base structure 100 may be formed as follows.

Figure 2:
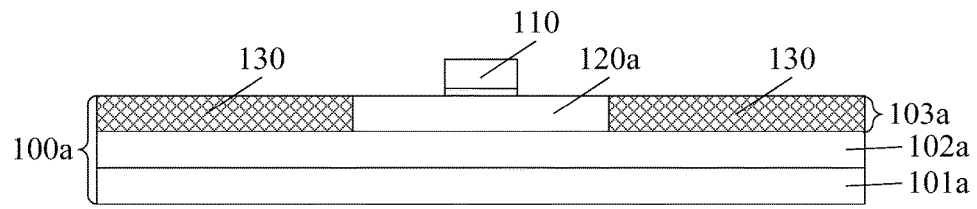
FIGS. 2-15 illustrates cross-sectional views of a semiconductor device at different stages of an exemplary fabrication process in accordance with various embodiments of the present disclosure.

As shown in FIG. 2, first, a first substrate 100a may be formed. The active layer 120 may be formed in the first substrate 100a. The insulating structure 130 may be formed in the active layer 120.

In one embodiment, the first substrate 100a may have a silicon on insulator (SOI) structure or the like. The first substrate 100a may include a bottom silicon layer 101a, an oxide layer 102a over the bottom silicon layer 101a, and a top silicon layer 103a over the oxide layer 102a. The active layer 120 may be formed in the top silicon layer 103a.

By using the SOI structure, a semiconductor layer may be formed over an insulator, such that dielectric isolation may be implemented in the devices in an integrated circuit. Parasitic latch-up effect in the semiconductor devices can be reduced or completely eliminated. An SOI structure may also provide advantages such as small parasitic capacitance, high integration degree, high speed, and simple fabrication process. Thus, SOI structures are widely used in RF technology.

By using an SOI structure as the first substrate 100a, the thickness of the active layer in the top silicon layer 103a may be desirably uniform, and it is easy to control the thickness of the active layer. It may be easier to form the active layer with a desired thickness.

Specifically, the first substrate 100a may be fabricated according to the following exemplary steps. First, the SOI structure may be provided. Further, the insulating structure 130 may be formed in the top silicon layer 103a. Ion implantation may be performed on the portion of the top silicon layer 103a between two portions of the insulating structure 130.

The portion of the active layer between the two portions of insulating structure 130 may be implanted with ions to form a well region 120a. The source-drain region of the transistor may be subsequently formed in the well region 120a. Thus, the well region 120a may be doped with dopants. The dopants in the well region 120a may be P-type ions or N-type ions.

Specifically, the insulating structure 130 may be formed as follows. First, a first patterned layer may be formed over the top silicon layer 103a. The first patterned layer may expose the portions of the top silicon layer 103 that correspond to the locations of the subsequently-formed insulating structure 130. Further, the first patterned layer may be used as the mask to etch the top silicon layer 103a to form insulating trenches. Further, a dielectric material may be deposited to fill the insulating trenches. The insulating structure 130 may be formed.

Further, the ion implantation process, performed on the portion of the top silicon layer 103a between the two portions of the insulating structure 130, may include the following steps. A second patterned layer may be formed over the top silicon layer 103a. The second patterned layer may expose the portion of the top silicon layer 103a corresponding to location of the subsequently-formed well region 120a. Further, the second patterned layer may be used as the mask for the ion implantation.

In one embodiment, the first patterned layer and the second patterned layer may each be a patterned photoresist layer. The first patterned layer and the second patterned layer may be formed through a spin-coating process, and an exposure and development process.

After the first substrate 100a is formed, the first gate structure 110 may be formed. Specifically, the first gate structure 110 may be formed over the well region 120a.

Specifically, the first gate structure 110 may include a first gate oxide layer on the well region 120a and a first gate electrode on the first gate oxide layer. In one embodiment, the well region 120a may be formed in the top silicon layer 103a. Thus, the fabrication steps to form the first gate structure 110 may include forming the first gate structure 110 over the top silicon layer 103*a*.

In one embodiment, the first gate oxide layer may be made of silicon oxide, and the first gate electrode may be made of polysilicon. The fabrication steps to form the first gate structure 110 may include the follows. First, a first gate oxide film may be formed over the first substrate 100*a*, and then a first gate electrode film may be formed over the first gate oxide film. Further, the first gate electrode film may be planarized. After the planarization, a first mask layer may be formed over the first gate electrode film. The first mask layer may cover the portion of the first gate electrode film that corresponds to the location of the subsequently-formed first gate electrode structure. The first mask layer may be used as a mask to etch the first gate electrode film and the first gate oxide film until the first substrate 100*a* is exposed. The first gate structure 110 may be formed.

In one embodiment, the first gate structure 110 may be directly used as the gate electrode of the transistor. Thus, after the abovementioned steps to form the first gate structure 110, a first protecting oxide layer may be formed over the first gate structure 110 to protect the first gate structure 110 from being damaged in subsequent fabrication steps. The first protecting oxide layer is not shown in the figures.

In other various embodiments, the first substrate 100*a* may be a semiconductor substrate.

Specifically, the semiconductor substrate may be made of a suitable semiconductor material such as silicon, silicon germanium, silicon carbide, silicon on insulator (SOI), germanium on insulator, glass, and/or Group III-V compounds (e.g., gallium nitride and/or gallium arsenide).

Subsequently, a thinning process may be performed on the back surface of the first substrate to expose the active layer. Accordingly, when the first substrate is a semiconductor substrate, the fabrication steps to form the first substrate may include the follows. First, a semiconductor base substrate may be provided. The semiconductor base substrate may include a first surface and a second surface. The active layer may be formed in the first surface. The second surface may be opposing the first surface or may be on the opposing side of the first surface. The semiconductor base substrate may also include a thinning-stop layer parallel with the first surface. The thinning-stop layer may be formed between the first surface and the second surface.

Specifically, the thinning-stop layer may be made of a suitable oxide material. Specifically, the thinning-stop layer may be formed through an epitaxial deposition process.

The active layer may be formed between the thinning-stop layer and the first surface. Specifically, the fabrication steps to form the first substrate may include the follows. First, the semiconductor base substrate may be provided. The insulating structure may be formed in the first surface. Further, an ion implantation process may be performed on the active layer between two insulating structure. Similarly, the active layer, positioned between two portions of the insulating structure and doped with ions, may form the well region. The well region may be configured to form the source-drain region of the transistor.

The active layer may be positioned between the thinning-stop layer and the first surface. Thus, the fabrication steps to form the first gate structure may include forming the first gate structure on the first surface of the semiconductor base substrate.

Figure 3:
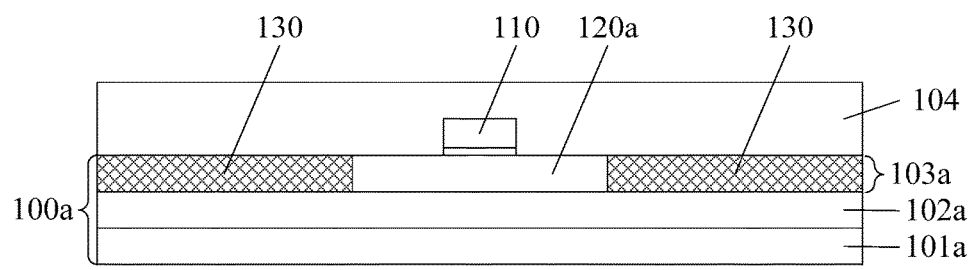

As shown in FIG. 3, after the first gate structure 110 is formed, a second interlayer dielectric layer 104, covering the first substrate 100*a* and the first gate structure 110, may be formed.

In one embodiment, after the first gate structure 110 is formed and before the second interlayer dielectric layer 104 is formed, the fabrication steps may further include the formation a first buffer layer (not shown). The first buffer layer may cover the first substrate 100*a* and the first gate structure 110, to reduce the lattice mismatch between the first substrate 100*a*/first gate structure 110 and the second interlayer dielectric layer 104. The first buffer layer may also increase or enhance the bonding between the first substrate 100*a*/first gate structure 110 and the second interlayer dielectric layer 104. Specifically, in one embodiment, the first buffer layer may be made of silicon nitride.

In one embodiment, the first gate structure 110 may be formed on the top silicon layer 103*a* of the first substrate 100*a*, which may be an SOI structure. Thus, the fabrication steps to form the second interlayer dielectric layer 104 may include forming the second interlayer dielectric layer 104 that covers the top silicon layer 103*a* and the first gate structure 110.

In one embodiment, the second interlayer dielectric layer 104 may be made of silicon oxide. The second interlayer dielectric layer 104 may be formed through a suitable deposition process, e.g., a chemical vapor deposition (CVD) process, on the top silicon layer 103*a* and the first gate structure 110.

In other various embodiments, the first substrate may be a semiconductor substrate and the first gate structure may be formed over the first surface of the semiconductor substrate. Thus, the fabrication steps to form the second interlayer dielectric layer may include forming the second interlayer dielectric layer that covers the first surface of the semiconductor substrate and the first gate structure.

Because the top surface of the second interlayer dielectric layer 104 may be subsequently bonded with a second substrate, after the second interlayer dielectric layer 104 is formed, the fabrication steps may further include planarizing the top surface of the second interlayer dielectric layer 104 to obtain a sufficiently flat surface for bonding. For example, in one embodiment, a chemical mechanical polishing (CMP) process may be performed to planarize the top surface of the second interlayer dielectric layer 104.

Figure 4:
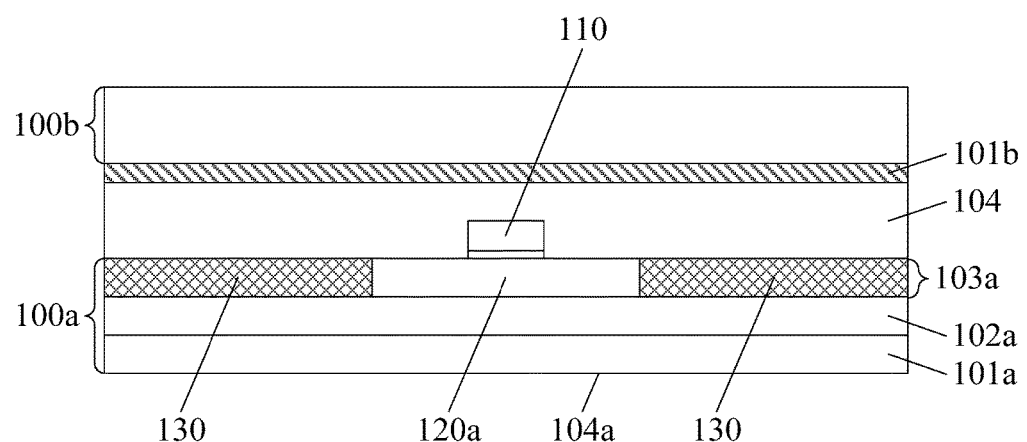

As shown in FIG. 4, a second substrate 100*b* may be provided. The second substrate 100*b* may be bonded with the second interlayer dielectric layer 104 of the first substrate 100*a*. The surface of the first substrate 100*a* not bonded with the second substrate 100*b* may be referred to as a back surface 104*a*.

Further, to form the bonding between the second substrate 100*b* and the second interlayer dielectric layer 104, after the second substrate 100*b* is provided, the fabrication steps may further include performing an amorphous pretreatment on the surface of the second substrate 100*b* to be bonded with the second interlayer dielectric layer 104.

Specifically, the second substrate 100*b* may include a bonding surface, i.e., the surface to be bonded with the second interlayer dielectric layer 104. The amorphous pretreatment performed on the bonding surface of the second substrate 100*b* may include bombarding the bonding surface of the second substrate 100*b* with ions to form a trap-rich well region on the bonding surface. The trap-rich well region may increase resistance and confine movements of electric charges. The ions may be, e.g., argon ions.

In one embodiment, before performing the amorphous pretreatment on the bonding surface of the second substrate 100*b*, the fabrication steps may further include forming a bonding layer 101*b* on the second substrate 100*b*. The second substrate 100*b* may be bonded with the second interlayer dielectric layer 104 through the bonding layer 101*b*.

Accordingly, the bonding surface of the second substrate 100*b* may be the surface of the bonding layer 101*b* that is not in contact with the second substrate 100*b*. Thus, the fabrication steps to perform the amorphous pretreatment on the bonding surface of the second substrate 100*b* may include performing the amorphous pretreatment on the surface of the bonding layer 101*b* that is not in contact with the second substrate 100*b*.

In one embodiment, the first substrate 100*a* may be an SOI structure. Thus, the back surface of the first substrate 100*a* may be the surface of the bottom silicon layer, of the SOI structure, that is not in contact with the oxide layer 102*a*. In other various embodiments, when the first substrate 100*a* is a semiconductor substrate, the back surface of the first substrate may be the second surface of the semiconductor substrate. The second surface may be the surface opposing to the first surface, which is formed with the first gate structure of the semiconductor substrate.

As shown in FIG. 5, a thinning process may be performed to thin the back surface 104*a* of the first substrate 100*a* and expose the surface of the active layer 120 that is away from the first gate structure 110. The base structure 100 may be formed.

Because a second gate structure may be formed over the side of the active layer 120 that is away from the first gate structure 110, the back surface 104*a* of the first substrate 100*a* may be thinned to expose the surface or side of the active layer 102 that is not formed with or is away from the first gate structure 110, to form the base structure 100.

In one embodiment, the first substrate 100*a* may be an SOI structure. Thus, the fabrication steps to thin the back surface 104*a* of the first substrate 100*a* may include sequentially removing the bottom silicon layer 101*a* and the oxide layer 102*a* of the first substrate 100*a*, to expose the surface of the channel region 102 in the top silicon layer 103*a*. The base structure 100 may be formed.

Specifically, the fabrication steps to sequentially remove the bottom silicon layer 101*a* and the oxide layer 102*a* of the first substrate 100*a* may include the follows. First, a CMP process may be performed to remove a portion of the total thickness of the bottom silicon layer 101*a* to improve the efficiency of the thinning process. Further, a wet etching process may be performed and the oxide layer 102*a* may be used as an etch stop layer to remove the remaining portion of the bottom silicon layer 101*a*. The wet etching process may be, e.g., an HF wet etch. Further, a dry etching process may be performed to remove a portion of the total thickness of the oxide layer 102*a*. Further, a wet etching process may be performed to remove the remaining portion of the oxide layer 102*a* and expose the surface of the active layer 120 in the top silicon layer 103*a*. The base structure 100 may be formed.

By applying an SOI structure to form the first substrate 100*a*, the oxide layer 102*a* in the SOI structure may be used as a thinning-stop layer for the thinning process. It may be easier to thin the back surface of the first substrate 100*a*, and the fabrication cost may be reduced.

In addition, when applying the wet etching process to remove the remaining portion of the oxide layer 102*a*, the over etch of the wet etching process may be controlled such that the wet etching process may expose the surface of the active layer 120 in the top silicon layer 103*a* without damaging the well region 120*a* in the active layer 120.

In other various embodiments, when the first substrate is a semiconductor substrate, the process to thin the back surface of the first substrate may include using the thinning-stop layer to thin the second surface of the semiconductor substrate, to expose the surface of the active layer in the semiconductor substrate. The base structure may be formed.

Specifically, a CMP process may be performed on the second surface of the semiconductor substrate to remove a portion of the total thickness of the semiconductor substrate. Further, a wet etching process may be performed to remove the remaining portion of the semiconductor substrate. The wet etching process may stop at the thinning-stop layer. Further, the thinning-stop layer may be removed to expose the surface of the active layer in the semiconductor substrate.

Similarly, when the thinning-stop layer is being removed, the over etch of the thinning-stop layer may also be controlled to prevent damages to the well region in the semiconductor substrate.

Figure 6:
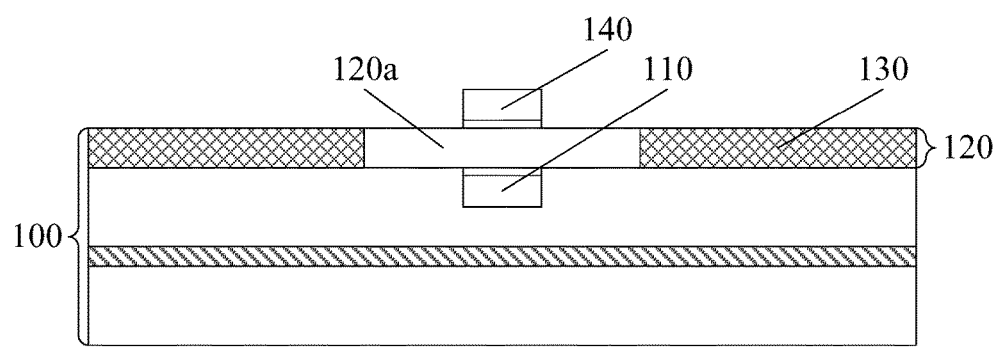

Returning to FIG. 16, after the base structure is formed, a second gate structure is formed over the active layer (S1602). FIG. 6 illustrates a corresponding structure.

As shown in FIG. 6, a second gate structure 140 may be formed over the active layer 120.

Specifically, the second gate structure 140 may be located on the well region 120*a*. The second gate structure may include a second gate oxide layer over the active layer 120 and a second gate electrode over the second gate oxide layer.

In one embodiment, the second gate oxide layer may be made of silicon oxide, and the second gate electrode may be made of polysilicon. The fabrication steps to form the second gate structure 140 may include the follows. First, a second gate oxide film may be formed over the base structure 100, and a second gate electrode film may be formed over the second gate oxide film. Further, the second gate electrode film may be planarized. After the planarization process, a second mask layer may be formed over the second gate electrode film. The second mask layer may cover the portion of the second gate electrode film for subsequently forming the second gate structure. Further, the second mask layer may be used as the mask for etching the second gate electrode film and the second gate oxide film until the base structure 100 is exposed. The second gate structure 140 may be formed.

In one embodiment, the second gate structure 140 may be directly used as the gate electrode of the transistor. Thus, after the second gate structure 140 is formed, the fabrication steps may further include forming a second protecting oxide layer (not shown) over the second gate structure 140 to protect the second gate structure 140 from being damaged in subsequent fabrication steps.

Figure 7:
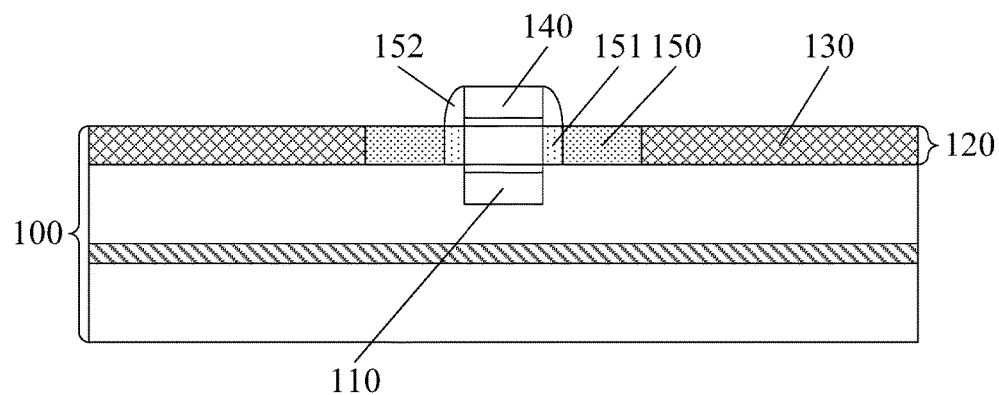

Returning to FIG. 16, after the second gate structure is formed, a source-drain region is formed in the active layer on the two sides of the second gate structure (S1603). FIG. 7 illustrates a corresponding structure.

Further, as shown in FIG. 7, the source-drain region 150 may be formed in the active layer 120 on two sides of the second gate structure 140. The source-drain region 150 may include the source region and the drain region of the transistor.

Specifically, the fabrication steps to form the source-drain region may include the follows. First, a lightly doped drain (LDD) implantation process may be formed to form LDDs 151 in the active layer 120 on the two sides of the second gate structure 140. Further, sidewalls 152 may be formed on the two sides of the second gate structure 140. Further, a source-drain implantation process may be performed to form the source-drain region 150 in the active layer 120 on the two sides of the second gate structure 140 and the sidewalls 152.

In one embodiment, the LDD implantation process may first be performed to form LDDs 151 in the well region at two sides of the second gate structure 140. Further, sidewalls may be formed on the two sides of the second gate structure 140. Further, the source-drain implantation process may be performed to form the source-drain region 150 in the active layer 120 on the two sides of the second gate structure 140 and the sidewalls 152. Thus, a channel region 102 may be formed in the well region under the second gate structure 140. The LDDs 151 may be positioned at the two ends of the channel region 102. The source-drain region 150 may be positioned on the two ends of the LDDs.

The LDD implantation process may be configured to define the position of the source-drain region 150 so that shallow junctions may be formed in the active layer 120 at two sides of the second gate structure 140. Channel leakage current between the source region and the drain region of the transistor may be reduced.

After the LDDs 151 are formed, sidewalls 152 may be formed on the two sides of the second gate structure 140 to surround the second gate structure 140 and prevent possible source-drain punch-through when the subsequent source-drain implantation process is performed too close to the channel region 102.

Specifically, the sidewalls 152 may be made of silicon oxide. The fabrication steps to form the sidewalls 152 may include the follows. First, a sidewall film, covering the base structure 100 and the second gate structure 140 may be formed. Further, a dry etching process may be performed to etch the sidewall film and form the sidewalls 152 on the two sides of the second gate structure 140.

For the first gate structure 110 and the second gate structure 140 to share the source-drain region 150, the fabrication steps to form the source-drain region 150 may include diffusing the source-drain region 150 towards the side of the active layer 120 that is closer to the first gate structure 110. In one embodiment, the ions of the source-drain region 150 may diffuse to the side of the active layer 120 that is closer to first gate structure 110.

If the active layer 120 is too thick, it may be more difficult to diffuse the implanted ions in the source-drain region 150 to the side of the active layer 120 that is closer to the first gate structure 110, and it may be more difficult to perform the source-drain implantation process. Thus, in one embodiment, the thickness of the active layer 120 may be less than about 1000 Å to reduce the fabrication difficulty and fabrication cost of the transistor.

Because the implanted ions in the source-drain region 150 diffuse to the side of the active layer 120 that is closer to the first gate structure 110, the first gate structure 110 may also be configured to control the on and off states between the source region and the drain region. In other words, the first gate structure 110 and the second gate structure 140 may share the source-drain region 150, the channel of the transistor may be formed not only in the active layer 120 closer to the second gate structure 140, but also in the active layer 120 closer to the first gate structure 110. Thus, the drain-to-source current or conducting current may be distributed at two sides of the active layer 120. Thus, the drain current of the transistor may be increased and the on-resistance of the transistor may be reduced. The transistor may have improved performance.

Figure 8:
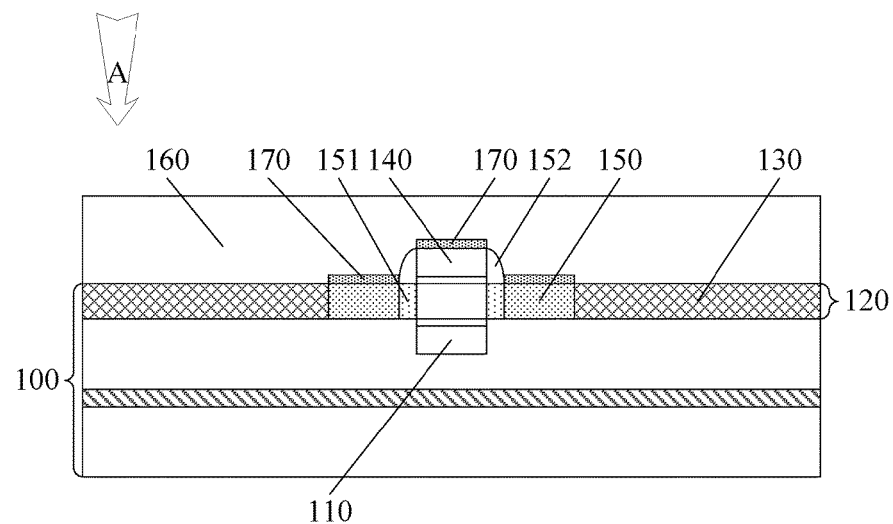

Returning to FIG. 16, after the source-drain region is formed, a first interlayer dielectric layer, covering the base structure and the second gate structure is formed (S1604). FIG. 8 illustrates a corresponding structure.

As shown in FIG. 8, after the source-drain region 150 is formed, a first interlayer dielectric layer 160, covering the base structure 100 and the second gate structure 140 may be formed.

In subsequent fabrication steps, plug structures connecting the second gate structure 140 and the source-drain region 150 may be formed to facilitate connections between the transistor and external circuit. To reduce the contact resistance between the plug structure and the second gate structure 140 and between the plug structure and the source-drain region 150, in one embodiment, after the source-drain region 150 is formed and before the first interlayer dielectric layer 160 is formed, the fabrication steps may further include forming a connection layer 170 covering the second gate structure 140 and the source-drain region 150.

The connection layer 170 may be made of a suitable metal silicide. In one embodiment, the connection layer 170 may be made of nickel silicide. Specifically, the fabrication steps to form the connection layer 170 may include the following. First, a patterned salicide blocking (SAB, not shown) layer may be formed. The patterned SAB layer may cover the base structure 100 and the sidewall 152, and may expose the second gate structure 140 and the source-drain region 150. The patterned SAB layer may be used as the mask for the deposition of the connection layer 170. The patterned SAB layer may be removed after the deposition so that the connection 170 may only cover the second gate structure 140 and the source-drain region 150.

Further, the first interlayer dielectric layer 160, covering the base structure 100, the sidewalls 152, and the connection layer 170, may be formed.

After the connection layer 170 is formed and before the first interlayer dielectric layer 160 is formed, the fabrication steps may further include forming a second buffer layer (not shown). The second buffer layer may cover the base structure 100, the sidewalls 170, and the connection layer 170, to reduce the lattice mismatch between the first interlayer dielectric layer 160 and the base structure 100, between the first interlayer dielectric layer 160 and the connection layer 170, and between the sidewalls 152 and the first interlayer dielectric layer 160. Specifically, the second buffer layer may be made of silicon nitride.

To improve the performance of the transistor, after the first interlayer dielectric layer 160 is formed, the fabrication steps may further include planarizing the first interlayer dielectric layer 160 to obtain a sufficiently flat surface, which provides fabrication convenient for subsequent fabrication steps.

Figure 9:
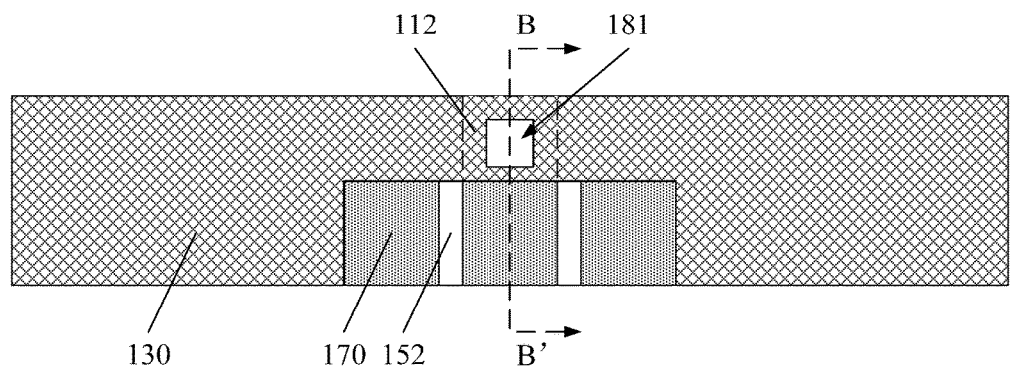
Figure 10:
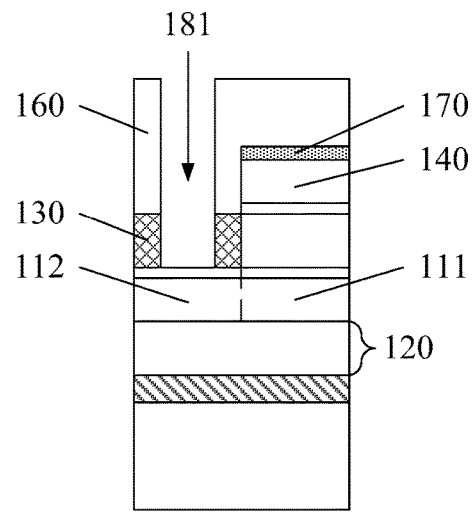

Returning to FIG. 16, after the first interlayer dielectric layer is formed, the first interlayer dielectric layer and the insulating layer are etched to form a first contact hole (S1605). FIGS. 9 and 10 illustrate corresponding structures.

FIG. 9 illustrates a top view of the structure of FIG. 8 along direction A, and FIG. 10 illustrates a cross-sectional view of the structure of FIG. 9 along direction B-B'. The first interlayer dielectric layer 160 and the insulating structure 130 may be etched to form a first contact hole 181. The first contact hole 181 may expose the first gate structure 110. For illustrative purposes, the first interlayer dielectric layer 160 is not shown in FIG. 9.

In one embodiment, the first gate structure 110, as shown in FIG. 8, may include a gate-controlled portion 111 and a connection portion 112. The gate-controlled portion 111 may be covered by the active layer 120 and the second gate structure 140. The connection portion 112 may not be covered by the active layer 120 and the second gate structure 140.

Thus, the fabrication steps to etch the first interlayer dielectric layer 160 and the insulating structure 130 to form the first contact hole 181, exposing the first gate structure 110, may include exposing the first gate structure 110 at the bottom of the first contact hole 181.

The first contact hole 181 may facilitate the connection between the first gate structure 110 and external circuit. By forming the first contact hole 181 in the first interlayer dielectric layer 160 and the insulating structure 130, the opening direction of the first contact hole 181 may be sufficiently the same as the opening direction of the second contact hole that is formed subsequently and exposes the second gate structure 140 and the drain region. Thus, the plug structures subsequently formed in the contact holes may face the same direction of the transistor. The structure to connect the transistor and the external circuit may be simplified.

Specifically, the fabrication steps to form the first contact hole 181 may include the follows. First, a third patterned mask layer may be formed over the first interlayer dielectric layer 160. The patterned third mask layer may expose the portion of the first interlayer dielectric layer 160 for forming the first contact hole 181. The third patterned layer may be used as the etch mask to etch the first interlayer dielectric layer 160 and the insulating structure 130 until the first gate structure 110 is exposed. The first contact hole 181 may be formed.

After forming the first contact hole 181, the fabrication steps may further include performing an ion implantation along the first contact hole 181 to form a contact hole doped region at the bottom of the first contact hole 181. The contact hole doped region may reduce the contact resistance between the first plug structure, subsequently formed in the first contact hole 181, and the first gate structure 110. The performance of the transistor may be improved.

Figure 11:
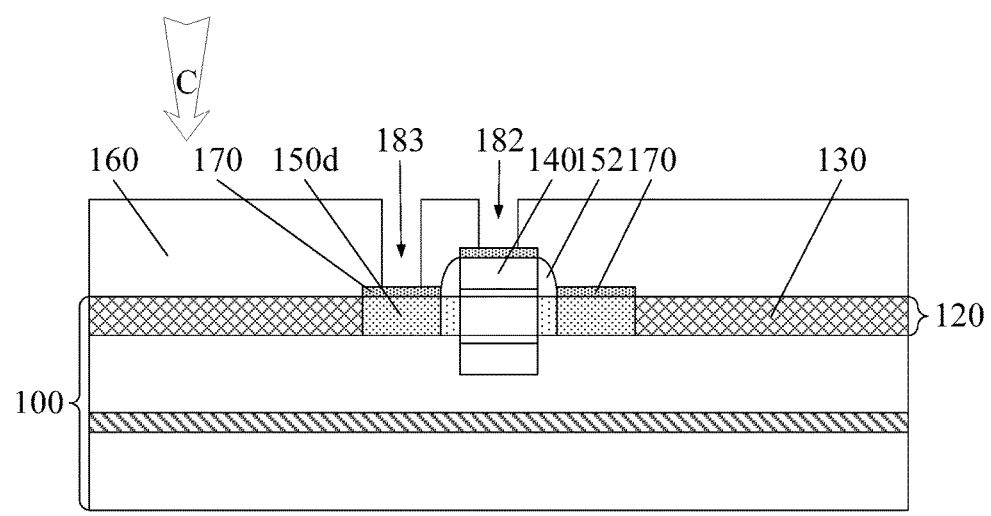
Figure 12:
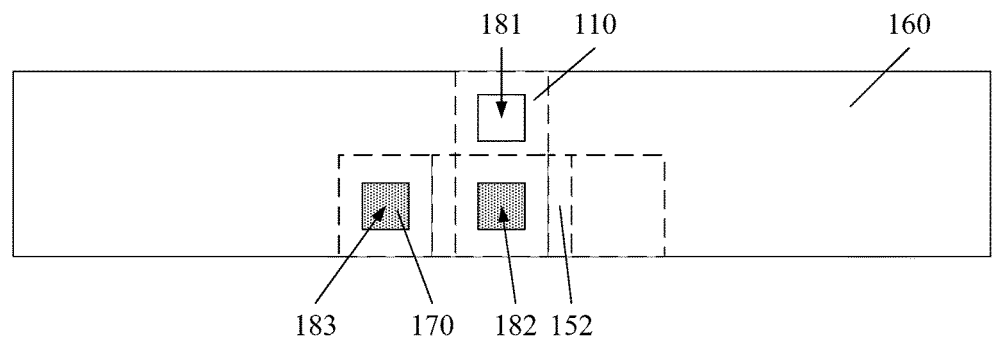

Returning to FIG. 16, after forming the first contact hole, the first interlayer dielectric layer is etched to form a second contact hole that exposes the second gate structure and form a third contact hole that exposes the drain region (S1606). FIGS. 11 and 12 illustrate corresponding structures.

As shown in FIGS. 11 and 12, FIG. 12 illustrates a top view of the structure of FIG. 11 along direction C. After the first contact hole 181 is formed, the first interlayer dielectric layer 160 may be etched to form a second contact hole 182 that exposes the second gate structure 140 and form a third contact hole 183 that exposes the drain region 150d.

In one embodiment, the connection layer 170 may cover the second gate structure 140 and the source-drain region 150. Accordingly, the bottom of the second contact hole 182 may expose the connection layer 170 over the second gate structure 140, and the bottom of the third contact hole 183 may expose the connection layer 170 over the drain region 150d.

In some other embodiments, the connection layer 170 may only be formed over the second gate structure 140 and one of the source region and the drain region. In this case, the source region or the drain region, formed with the connection layer 170, may be the region subsequently connected with the third contact hole 183.

Specifically, the fabrication steps to form the second contact hole 182 and the third contact hole 183 may include the follows. First, the third patterned mask layer may be formed over the first interlayer dielectric layer 160. The third patterned mask layer may expose the portions of the first interlayer dielectric layer 160 for forming the second contact hole 182 and the third contact hole 183. The third patterned mask layer may be used as the mask to etch the first interlayer dielectric layer 160 until the connection layer 170, over the second gate electrode 140 and the drain region 150d, are exposed.

Figure 13:
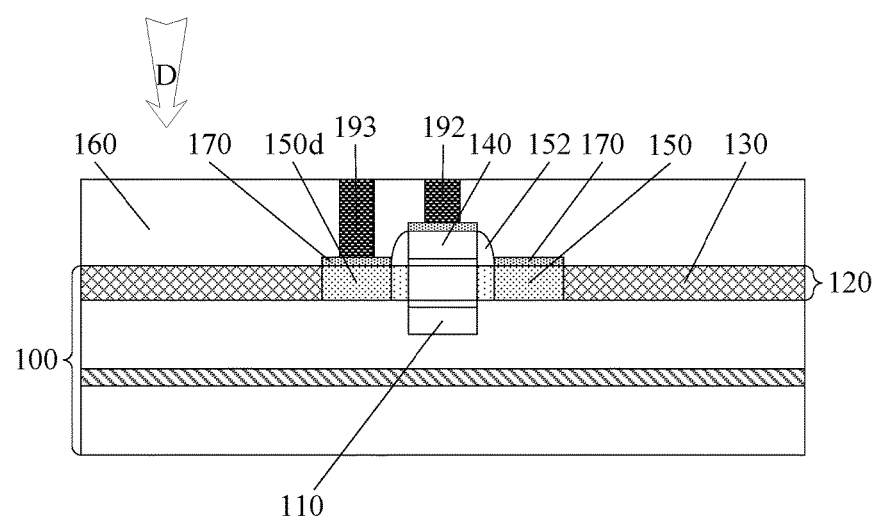
Figure 14:
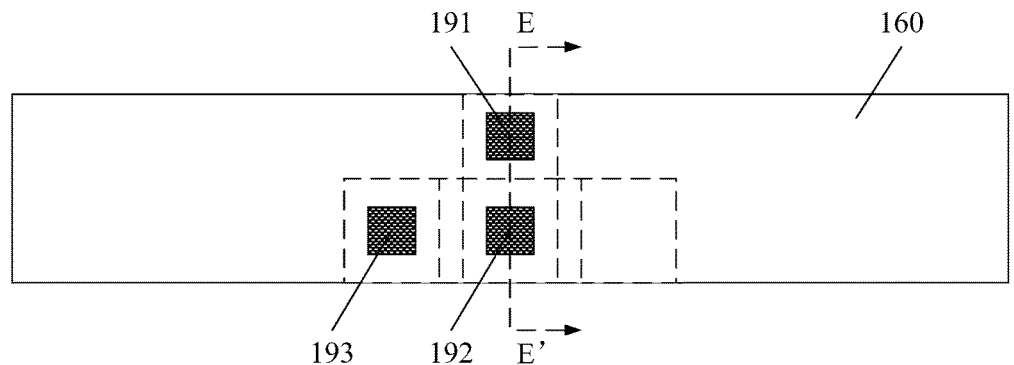

Returning to FIG. 16, after the first contact hole, the second contact hole, and the third contact hole are formed, a conductive material may be used to fill in the first contact hole, the second contact hole, and the third contact hole to form a first plug structure, a second plug structure, and a third plug structure (S1607). FIGS. 13-15 illustrate corresponding structures.

As shown in FIGS. 13-15, FIG. 14 illustrates a top view of the structure of FIG. 13 along direction D, and FIG. 15 illustrates a cross-sectional view of the structure of FIG. 14 along direction E-E'. The first contact hole 181, the second contact hole 182, and the third contact hole 183 may be filled with a conductive material to form a first plug structure 191, a second plug structure 192, and a third plug structure 193, respectively.

The first plug structure 191, the second plug structure 192, and the third plug structure 193 may each be made of one or more of tungsten, aluminum, silver, chromium, molybdenum, nickel, palladium, platinum, titanium, tantalum, and copper. The specific types of metal to form the first plug structure 191, the second plug structure 192, and the third plug structure 193 should be subjected to different applications and designs, and should not be limited according to the embodiments of the present disclosure.

Specifically, the fabrication steps to form the first plug structure 191, the second plug structure 192, and the third plug structure 193 may include connecting the first plug structure 191 with the first gate structure 110, connecting the second plug structure 192 with the second gate structure 140 through the connection layer 170 over the second gate structure 140, and connecting the third plug structure 193 with the drain region 150d through the connection layer 170 over the drain region 150d.

In the present disclosure, the first gate structure may be formed in the base structure. The first plug structure, formed in the first interlayer dielectric layer and the insulating structure, may facilitate connection between the first gate structure and external circuit. The second gate structure may be formed on the active layer. That is, the disclosed transistor may include two gate structures positioned on the upper side and on the lower side of the active layer. The two gate structures may share the source-drain region. Thus, the channel of the transistor may be distributed on the two sides (e.g., top side and bottom side) of the active layer formed with gate structures. Thus, the source-drain current of the transistor may be distributed on the two sides of the active layer. The drain current of the transistor may be increased and the on-resistance of the transistor may be reduced. The disclosed transistor and the chip containing the disclosed transistor may have improved performance.

Another aspect of the present disclosure provides a transistor.

The transistor may include a base structure. The base structure may include a first gate structure and an active layer. The first gate structure may be contained in the base structure, and the active layer may cover the first gate structure. The insulating structure may be formed in the active layer. The transistor may further include a second gate structure formed on the active layer, and a source-drain region positioned in the active layer on the two sides of the second gate structure. The transistor may further include a first interlayer dielectric layer covering the base structure and the second gate structure. The transistor may further include a first plug structure, a second plug structure, and a third plug structure. The first plug structure may be formed in the first interlayer dielectric layer and the insulating structure and may be connected to the first gate structure. The second plug structure may be formed in the first interlayer dielectric layer and may be connected to the second gate structure. The third plug structure may be formed in the first interlayer dielectric layer and may be connected to the drain region.

As shown in FIGS. 13-15, an exemplary structure of the disclosed transistor is shown. FIG. 14 illustrates a top view of the structure of FIG. 13 along direction D, and FIG. 15 illustrates a cross-sectional view of the structure of FIG. 14 along direction E-E'.

The disclosed transistor may include a base structure 100. The base structure 100 may include a first gate structure 110 in the base structure 100 and an active layer 120 covering the first gate structure 110. An insulating structure 130 may be formed in the active layer 120.

In one embodiment, the first gate structure 110 may include a first gate electrode and a first gate oxide layer over the first gate electrode. The first gate electrode may be made of, e.g., polysilicon. The first gate oxide layer may be made of, e.g., silicon oxide.

Because the first gate structure 110 may be directly used as a gate electrode of the disclosed transistor, a first protecting oxide layer (not labeled in FIGS. 13-15) may be formed over the first gate structure 110 to protect the first gate structure 110 from being damaged in subsequent fabrication steps.

The disclosed transistor may also include a second gate structure 140 over the active layer 120 and a source-drain region 150 in the active layer 120 on two sides of the second gate structure 140.

For the first gate structure 110 and the second gate structure 140 to share the source-drain region 150, the fabrication steps to form the source-drain region 150 may include diffusing the implanted ions in the source-drain region 150 towards the side of the active layer 120 that is closer to the first gate structure 110. In one embodiment, the ions of the source-drain region 150 may diffuse to the side of the active layer 120 that is closer to first gate structure 110.

If the active layer 120 is too thick, it may be more difficult to diffuse the ions in the source-drain region 150 to the side of the active layer 120 that is closer to the first gate structure 110, and it may be more difficult to perform the source-drain implantation process. Thus, in one embodiment, the thickness of the active layer 120 may be less than about 1000 Å to reduce the fabrication difficulty and fabrication cost of the transistor.

The second gate structure 140 and the first gate structure 110 may control the on and off states between the drain region and the source region at the same time. Thus, the source-drain current or conducting current between the source region and the drain region may be distributed along two sides of the active layer 120. One side of the active layer 120 may be closer to the first gate structure 110 and the other side of the active layer 120 may be closer to the second gate structure 140. The drain current of the transistor may be increased and the on-resistance of the transistor may be reduced. The transistor and the chip containing the transistor may have improved performance.

The transistor may further include sidewalls 152 on the two sides of the second gate structure 140, and LDDs 151 under the sidewalls 152. The source-drain region 150 may be positioned at the two sides of the LDDs 151. The sidewalls 152 positioned on the two sides of the second gate structure may protect the channel, of the transistor, under the second gate structure 140 and prevent possible damages when the source-drain implantation process is too close to the channel region 102. The LDDs 151 in the active layer 120 may reduce the channel leakage current between the source region and the drain region of the transistor.

The transistor may further include a first interlayer dielectric layer 160 covering the base structure 100 and the second gate structure 140.

The first interlayer dielectric layer 160 may provide insulation between the disclosed transistor and other metal layers. Specifically, the first interlayer dielectric layer 160 may be made of an oxide material.

The transistor may further include a first plug structure 191, a second plug structure 192, and a third plug structure 193. The first plug structure 191 may be formed in the first interlayer dielectric layer 160 and an insulating structure 130 and may be connected to the first gate structure 110. The second plug structure 192 may be formed in the first interlayer dielectric layer 160 and may have contact with the second gate structure 140. The third plug structure 193 may be formed in the first interlayer dielectric layer 160 and may have contact with the drain region 150d.

The first plug structure 191, the second plug structure 192, and the third plug structure 193 may each be made of one or more of tungsten, aluminum, silver, chromium, molybdenum, nickel, palladium, platinum, titanium, tantalum, and copper. The specific types of metal to form the first plug structure 191, the second plug structure 192, and the third plug structure 193 should be subjected to different applications and designs and should not be limited by the embodiments of the present disclosure.

As shown in FIGS. 14 and 15, to ensure the first plug structure 191, the second plug structure 192, and the third plug structure 193 are aligned along substantially the same direction and the transistor can be connected to external circuit from the same side, in one embodiment, the first gate structure 110 may include a gate-controlled portion 111 and a connection portion 112. The gate-controlled portion 111 may be covered by the active layer 120 and the second gate structure 140. The connection portion 112 may not be covered by the active layer 120 and the second gate structure 140. The first plug structure 191 may be connected to the connection portion 112 of the first gate structure 110.

Further, to reduce the contact resistance between the second plug structure 192 and the second gate structure 140, and between the third plug structure 193 and the source-drain region 150, in one embodiment, the disclosed transistor may further include a connection layer 170 covering the second gate structure 140 and the source-drain region 150. Specifically, the connection layer 170 may be made of metal silicide, e.g., nickel silicide.

Compared to a conventional transistor, the disclosed transistor and the method for forming the transistor provided in the current disclosure have the following advantages.

For example, in the present disclosure, the first gate structure may be formed in the base structure. The first plug structure, formed in the first interlayer dielectric layer and the insulating structure, may facilitate connection between the first gate structure and external circuit. The second gate structure may be formed on the active layer. That is, the disclosed transistor may include two gate structures positioned on the top side and on the bottom side of the active layer. The two gate structures may share the source-drain region. Thus, the channel of the transistor may be distributed on the two sides of the active layer formed with gate structures. Thus, the source-drain current of the transistor may be distributed on the two sides of the active layer. The drain current of the transistor may be increased and the on-resistance of the transistor may be reduced. The disclosed transistor and the chip containing the disclosed transistor may have improved performance.

In some embodiments, when forming the base structure, an SOI structure may be used as a first substrate to ensure the active layer formed in the top silicon layer has a desirably uniform thickness. After the first gate structure is formed, when the back surface of the first substrate is being thinned, the oxide layer in the SOI structure may be used as a thinning-stop layer to reduce the fabrication difficulty in thinning the back surface of the first substrate. In addition, using an SOI structure as the first substrate may also make thickness of the active layer easier to control. Thus, fabrication difficulty to form an active layer with a desired thickness can be reduced. That is, by using an SOI structure, the fabrication cost of the transistor may be reduced.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming a transistor, comprising:
    forming a base structure, containing a first gate structure, an active layer covering the first gate structure, and an insulating structure in the active layer;
    forming a second gate structure on the active layer;
    forming a source-drain region, including a source region and a drain region in the active layer each on a different side of the second gate structure;
    forming a first interlayer dielectric layer covering the base structure and the second gate structure;
    forming a first contact hole that exposes the first gate structure by etching the first interlayer dielectric layer and the insulating structure;
    forming a second contact hole that exposes the second gate structure and a third contact hole that exposes the drain region by etching the first interlayer dielectric layer; and
    filling the first contact hole, the second contact hole, and the third contact hole with a conductive material to form a first plug structure, a second plug structure, and a third plug structure, that are aligned along a substantially same direction.

2. The method according to claim 1, wherein forming the base structure comprises:
    forming a first substrate, the first substrate containing the active layer, the active layer containing the insulating structure and a well region between two portions of the insulating structure;
    forming the first gate structure on the first substrate;
    forming a second interlayer dielectric layer covering the first substrate and the first gate structure;
    providing a second substrate to be bonded with the second interlayer dielectric layer; and
    thinning a back surface of the first substrate to expose the active layer.

3. The method according to claim 2, the first substrate comprising a silicon on insulator (SOI) structure, having a bottom silicon layer, an oxide layer over the silicon bottom layer, and a top silicon layer over the oxide layer, the active layer being in the top silicon layer, wherein:
    the first gate structure is formed on the top silicon layer;
    the second interlayer dielectric layer covers the top silicon layer and the first gate structure;
    the back surface of the first substrate is a surface of the bottom silicon layer facing away from the oxide layer; and
    the bottom silicon layer and the oxide layer are removed sequentially to expose the active layer.

4. The method according to claim 3, wherein forming the first substrate includes:
    providing the SOI structure;
    forming the insulating structure in the top silicon layer; and
    performing an ion implantation process on a portion of the top silicon layer between the two portions of the insulating structure.

5. The method according to claim 3, wherein removing the bottom silicon layer and the oxide layer includes:
    performing a chemical mechanical polishing (CMP) process to remove a portion of a total thickness of the bottom silicon layer;
    using the oxide layer as a thinning-stop layer to perform a wet etching process to remove a remaining portion of the bottom silicon layer;
    performing a dry etching process to remove a portion of a total thickness of the oxide layer; and
    performing a wet etching process to remove a remaining portion of the oxide layer to expose the active layer.

6. The method according to claim 2, the first substrate comprising a semiconductor substrate, having a first surface containing the active layer, a second surface opposing the first surface, and a thinning-stop layer parallel with the first surface, the active layer being between the thinning-stop layer and the first surface, wherein:
    the first gate structure is formed on the first surface of the semiconductor substrate;
    the second interlayer dielectric layer covers the first surface and the first gate structure;
    the back surface of the first substrate is the second surface of the semiconductor substrate; and
    the thinning of the back surface stops at the thinning-stop layer to expose the active layer.

7. The method according to claim 6, wherein forming the first substrate includes:
    providing the semiconductor substrate;
    forming the insulating structure in the first surface of the semiconductor substrate; and
    performing an ion implantation process on a portion of the top silicon layer between the two portions of the insulating structure.

8. The method according to claim 6, wherein thinning the back surface of the semiconductor substrate includes:
    performing a CMP process to remove a portion of a total thickness of the semiconductor substrate;
    performing a wet etching process to remove a remaining portion of the semiconductor substrate, the wet etching process stopping at the thinning-stop layer; and
    removing the thinning-stop layer to expose the active layer.

9. The method according to claim 1, wherein forming the source-drain region includes:
    performing a lightly doped drain (LDD) implantation process to form LDDs in the active layer at two sides of the second gate structure;

forming sidewalls on two sides of the second gate structure; and performing a source-drain ion implantation process to form the source-drain region in the active layer at the two sides of the second gate structure.

10. The method according to claim 1, wherein after forming the source-drain region and before forming the first interlayer dielectric layer, further includes forming a connection layer covering the second gate structure and the source-drain region, wherein:
- a bottom of the second contact hole exposes a first connection layer on the second gate structure such that the second plug structure is connected to the second gate structure though the first connection layer; and
- a bottom of the third contact hole exposes a second connection layer on one of the drain region and the source region such that the third plug structure is connected to the one of the drain region and the source region through the second connection layer.

11. The method according to claim 1, wherein a thickness of the active layer is less than about 1000 Å.

12. The method according to claim 9, further including diffusing implanted ions in the source-drain region to a side of the active layer that is closer to the first gate structure.

13. The method according to claim 1, wherein after forming the first contact hole and before forming the first plug structure, the method further includes:
performing an ion implantation along the first contact hole to form a contact hole doped region at a bottom of the first contact hole.

14. The method according to claim 1, wherein the first gate structure includes: a gate-controlled portion covered by the active layer and the second gate structure; and a connection portion not covered by the active layer and the second gate structure.

15. The method according to claim 14, wherein a bottom of the first contact hole exposes the first gate structure so that the first plug structure is connected to the connection portion of the first gate structure.

16. A transistor, comprising:
- a base structure, containing a first gate structure, an active layer covering the first gate structure, and an insulating structure in the active layer, the first gate structure including a gate-controlled portion and a connection portion;
- a second gate structure on the active layer, the first gate structure and the second gate structure sharing the active layer, wherein the gate-controlled portion is covered by the second gate structure and the connection portion is not covered by the second gate structure;
- a source-drain region, having a source region and a drain region in the active layer, each on a different side of two sides of the first gate structure and the second gate structure, wherein
  - lightly doped regions (LDDs) are in the active layer on the two sides of the second gate structure, the lightly doped regions (LDDs) have same thickness as the source-drain region,
  - the source-drain region each locates on a different side of two sides of the LDDs;
- a first interlayer dielectric layer covering the base structure and the second gate structure;
- a first plug structure, in the first interlayer dielectric layer and the insulating structure, being connected to the first gate structure;
- a second plug structure, in the first interlayer dielectric layer, being connected to the second gate structure; and
- a third plug structure, in the first interlayer dielectric layer, being connected to the drain region, wherein the first plug structure, the second plug structure, and the third plug structure being aligned along a substantially same direction, wherein
  - the first plug structure, the second plug structure, and the third plug structure are perpendicular to a top surface of the first interlayer dielectric layer, and
  - the first plug structure and the second plug structure are aligned in a direction perpendicular to a direction the second plug structure and the third plug structure are aligned.

17. The transistor according to claim 16, the first gate structure comprising a gate-controlled portion covered by the active layer and the second gate structure and a connection portion not covered by the active layer and the second gate structure, wherein the first plug structure is connected to the connection portion of the first gate structure.

18. The transistor according to claim 16, wherein a thickness of the active layer is less than about 1000 Å.

19. The transistor according to claim 16, further comprising:
sidewalls on two sides of the second gate structure.

20. The transistor according to claim 16, further comprising a connection layer covering the second gate structure and the drain region, wherein the second plug structure is electrically connected to the second gate structure through the connection layer and the third plug structure is electrically connected to the drain region through the connection layer.

* * * * *